(12) United States Patent
Park (10) Patent No.: US 8,513,665 B2
(45) Date of Patent: Aug. 20, 2013

(54) DISPLAY DEVICE WITH DUMMY DATA LINES

(75) Inventor: Ji Ryun Park, Cheonan-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/160,421

(22) Filed: Jun. 14, 2011

(65) Prior Publication Data

US 2012/0104394 A1 May 3, 2012

(30) Foreign Application Priority Data

Nov. 1, 2010 (KR) .................. 10-2010-0107826

(51) Int. Cl.
*H01L 29/04* (2006.01)
(52) U.S. Cl.
USPC .................. 257/59; 257/72; 257/E27.132
(58) Field of Classification Search
USPC ......... 257/59, 72, E33.003, E33.004; 345/87
See application file for complete search history.

(56) References Cited

U.S. PATENT DOCUMENTS

| 5,408,252 | A | 4/1995 | Oki et al. |
| 2009/0190082 | A1 | 7/2009 | Lee et al. |
| 2009/0262054 | A1* | 10/2009 | Hsu et al. .................. 345/87 |
| 2010/0320472 | A1* | 12/2010 | Liu ............................ 257/59 |

FOREIGN PATENT DOCUMENTS

| KR | 10-2007-0082244 A | 8/2007 |
| KR | 10-2009-0081838 A | 7/2009 |

* cited by examiner

*Primary Examiner* — Bilkis Jahan
(74) *Attorney, Agent, or Firm* — Knobbe Martens Olson & Bear LLP.

(57) ABSTRACT

A display device in which various embodiments can prevent a vertically-striped blur is disclosed. In one aspect, the display device includes first gate lines, second gate lines, data lines, dummy data lines, and a plurality of pixels. The first and second gate lines are extended in a first direction. The data lines and the dummy data lines are extended in a second direction intersecting the first direction. The pixels are defined by the intersection of a first gate line of the first gate lines and a first data line of the data lines.

9 Claims, 4 Drawing Sheets

DISPLAY DEVICE WITH DUMMY DATA LINES

CROSS-REFERENCE TO RELATED APPLICATIONS

This U.S. non-provisional patent application claims priority under 35 U.S.C. §119 of Korean Patent Application No. 10-2010-0107826, filed on Nov. 1, 2010 the entire contents of which are hereby incorporated by reference.

BACKGROUND

The disclosed technology relates to a display device, and more particularly, to a display device including a display substrate.

Generally, display devices include a plurality of data lines, and a plurality of gate lines that intersect the data lines. A plurality of pixels are defined by the data lines and the gate lines. Recently, the use of display devices in compact devices has attracted the attention of the research community. With the increased use of display devices and the miniaturization of display drivers, research and development for display devices that reduce the number of data lines has attracted great attention.

SUMMARY OF CERTAIN INVENTIVE ASPECTS

According to some aspects, a display device which removes a parasitic capacitance difference between pixel electrodes and a data line is disclosed.

According to some aspects, a display device is disclosed. The display device includes a plurality of first gate lines and a plurality of second gate lines configured to extend in a first direction, a plurality of data lines and a plurality dummy data lines configured to extend in a second direction, the first direction intersecting the second direction, and a plurality of pixels disposed at the intersections of the first gate lines and data lines. Each of the pixels includes a first switching device connected to a first gate line of the plurality of first gate lines, and one of a first data line of the plurality of data lines and a first dummy data line of the plurality of dummy data lines; and a second switching device connected to a second gate line of the plurality of second gate lines, and the other one of first data line of the plurality of data lines and the first dummy data line of the plurality of dummy data lines. Each of the pixels may further include a first pixel electrode connected to the first switching device, and provided between the first data line and the first dummy data line; and a second pixel electrode connected to the second switching device, and separated from the first pixel electrode while interposing one of the first data line and the first dummy data line therebetween. The first data line is connected with the first dummy data line.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF CERTAIN INVENTIVE EMBODIMENTS

Exemplary embodiments will be described below in more detail with reference to the accompanying drawings. The inventive concept may, however, be embodied in different forms and should not be construed as limited to the embodiments set forth herein. Rather, these embodiments are disclosed so that this disclosure will be thorough and complete, and will fully convey the scope of the inventive concept to those skilled in the art. Further, the present invention is only defined by scopes of claims. Like reference numerals refer to like elements throughout.

In the following description, the technical terms are used only to explain a specific exemplary embodiment while not limiting the present invention. The terms of a singular form may include plural forms unless otherwise indicated. The meaning of "include," "comprise," "including," or "comprising," specifies a property, a region, a fixed number, a step, a process, an element and/or a component but does not exclude other properties, regions, fixed numbers, steps, processes, elements and/or components. The order of the reference numerals disclosed below in describing the various embodiments is not limited to the order provided below.

Figure 1:
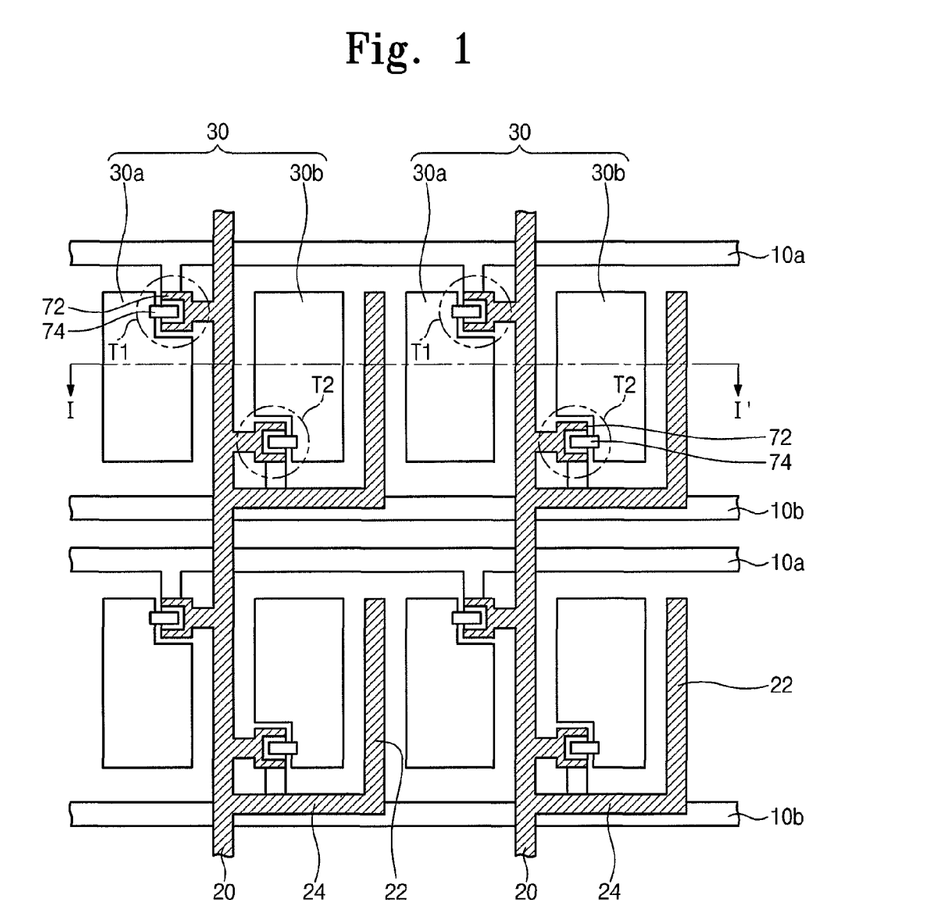
FIG. 1 is a plan view illustrating a display device according to some embodiments.
Figure 2:
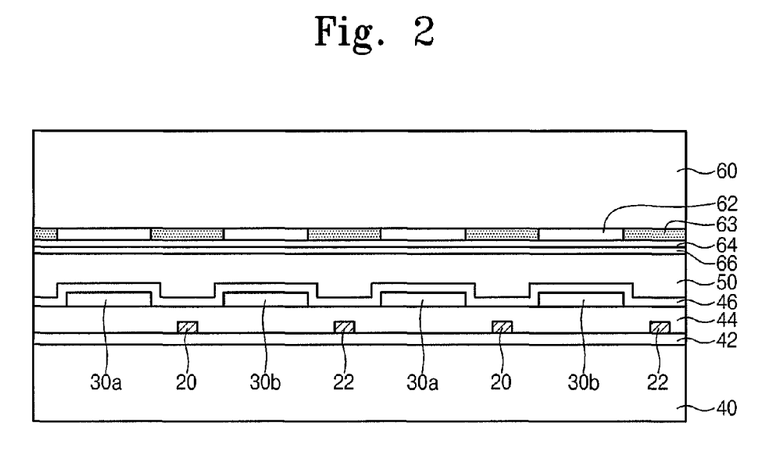
FIG. 2 is a cross-sectional view taken along line I-I' of FIG. 1.
Figure 3:
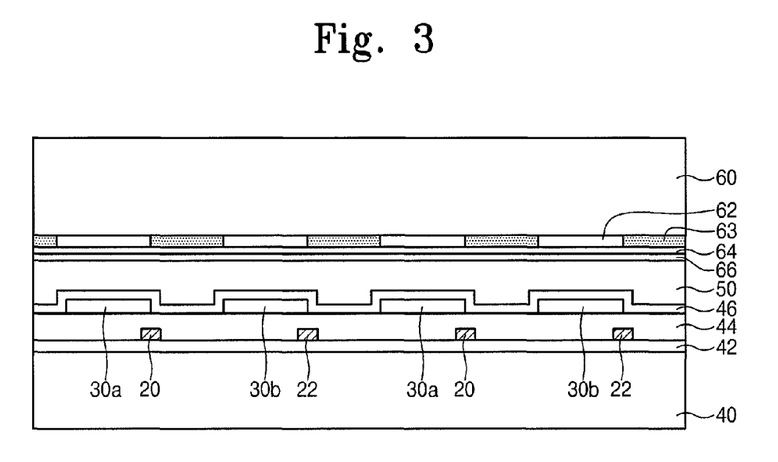
FIG. 3 is a cross-sectional view illustrating a case where data lines of FIG. 2 are misaligned.
Figure 4A:
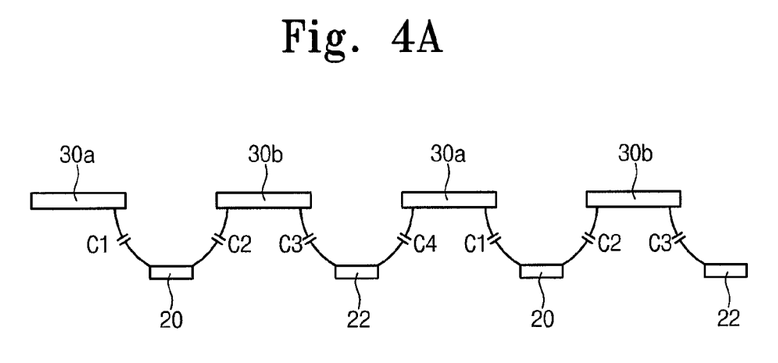
FIGS. 4A and 4B illustrate a change of a parasitic capacitance between data lines and first and second pixel electrodes.
Figure 4B:
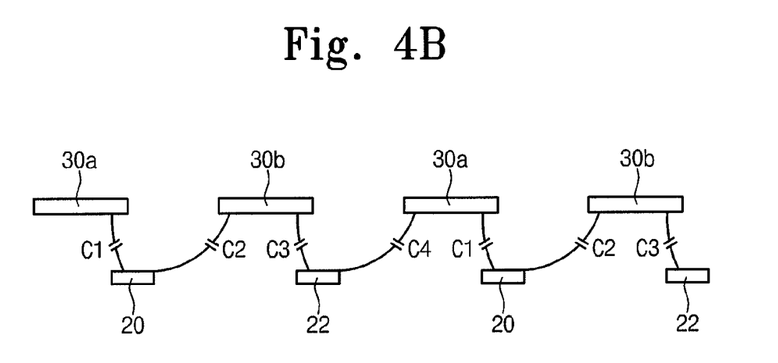

FIG. 1 is a plan view illustrating a display device according to some embodiments. FIG. 2 is a cross-sectional view taken along line I-I' of FIG. 1. FIG. 3 is a cross-sectional view illustrating a case where the data line of FIG. 2 is misaligned. FIGS. 4A and 4B are views for conceptually describing a change of a parasitic capacitance between a data line and first and second pixel electrodes.

Referring to FIGS. 1 to 4B, a display device according to some embodiments may include a plurality of first gate lines 10a, a plurality of second gate lines 10b, a plurality data lines 20, a plurality dummy data lines 22, a plurality of connection lines 24, a plurality of first pixel electrodes 30a, and a plurality of second pixel electrodes 30b. As described herein, the first gate lines, the second gate lines, the data lines, the dummy data lines, the first pixel electrodes, and the second pixel electrodes may be explained in a singular form in one pixel for convenience. The first and second pixel electrodes 30a and 30b are alternately disposed between the first and second gate lines 10a and 10b. The first and second gate lines 10a and 10b are extended in a first direction. One of the first and second pixel electrodes 30a and 30b is disposed between the data line 20 and the dummy data line 22. The dummy data lines 22 may be extended in a second direction intersecting the first direction. The data line 20 and the dummy data line 22 may be connected by a connection line 24 that is disposed in the first direction.

The data line 20 and the dummy data line 22 may be disposed between the first pixel electrode 30a and the second pixel electrode 30b. The data line 20 and the dummy data line 22 may be disposed at an equal distance. Even when the data line 20 and the dummy data line 22 are misaligned in the first direction, they may be symmetrically shifted without change of a parasitic capacitance with respect to the first and second pixel electrodes 30a and 30b. Accordingly, the display device according to some embodiments can prevent an image quality from being degraded by misalignment of the data line 20.

With reference to FIGS. 2 and 3, a liquid crystal layer 50 may be disposed between a upper display substrate 60 and a lower display substrate 40 that face one another. The physical characteristic of the liquid crystal layer 50 may be changed according to operations of first and second switching devices T1 and T2, illustrated in FIG. 1. For example, the liquid crystal layer 50 can shield or pass light that is transmitted in a direction from the lower display substrate 40 to the upper display substrate 60 according to a change of an electric field that is induced between a common electrode 64 and the first and second pixel electrodes 30a and 30b.

The liquid crystal layer 50 may be aligned between a first alignment layer 46 of the lower display substrate 40 and a second alignment layer 66 of the upper display substrate 60. A portion of light that travels from the lower display substrate 40 and the liquid crystal layer 50 may be transmitted in combination with a color that is provided by the color filter layer 62 of the upper display substrate 60. Another portion of light may be shielded by a black matrix layer 63. The black matrix layer 63 may be disposed on the first gate line 10a, the second gate line 10b, the data line 20, the dummy data line 22, and the connection line 24. The color filter layer 62 may be disposed on the first and second pixel electrodes 30a and 30b. The color filter layer 62 may include a pigment including three primary colors of red, green, and blue.

A pair of first and second pixel electrodes 30a and 30b may be defined as one pixel 30. Each of the first and second pixel electrodes 30a and 30b may correspond to a unit pixel. Since the pixel 30 includes the first and second pixel electrodes 30a and 30b, it may control light that has a plurality of colors among the three primary colors of the color filter layer 62. The first and second pixel electrodes 30a and 30b may include transparent indium tin oxide (ITO). The first pixel electrode 30a may be connected to the first switching device T1. The second pixel electrode 30b may be connected to the second switching device T2.

The first switching device T1 may be connected to the first gate line 10a and the data line 20. The first switching device T1 may switch a data signal that is applied from the data line 20 to the first pixel electrode 30a. The first switching device T1 may be turned on by a scan signal that is applied to the first gate line 10a. The second switching device T2 may be connected to the second gate line 10b and the data line 20. The second switching device T2 may switch a data signal that is applied from the data line 20 to the second pixel electrode 30b. Each of the first and second switching devices T1 and T2 may be a thin film transistor. As illustrated in FIG. 1, the thin film transistor may include a source electrode 72 extended from the data line 20, and a drain electrode 74. The drain electrode of the thin film transistor T1 overlaps with the first pixel electrode 30a, and the drain electrode of the thin film transistor T2 overlaps with the second pixel electrode 30b. The drain electrode 74 may be electrically connected to the first and second pixel electrodes 30a and 30b by a contact electrode (not shown) that passes through a passivation layer 44.

The first and second gate lines 10a and 10b may be adjacently disposed as a pair between the first pixel electrodes 30a that are arranged in the second direction. The first and second gate lines 10a and 10b may be disposed between the lower display substrate 40 and a gate dielectric 42. A scan signal may be sequentially applied to the first and second gate lines 10a and 10b. The scan signal may be applied to the first and second gate lines 10a and 10b in a dual bank driving scheme. A gate driver may be disposed in both side edges of the lower display substrate 40. The side edges of the lower display substrate 40 having each of the drivers are formed to face each other. A driver disposed in a left edge may apply a scan signal to the first gate line 10a, and a driver disposed in a right edge may apply a scan signal to the second gate line 10b.

The data line 20 may be disposed on the gate dielectric 42. The data line 20 may be insulated from the first and second gate lines 10a and 10b by the gate dielectric 42. The passivation layer 44 may be disposed on the data line 20. The first and second pixel electrodes 30a and 30b may be disposed on the passivation layer 44. The passivation layer 44 may include a dielectric such as silicon nitride or silicon oxide. The data line 20 may be insulated from the first and second pixel electrodes 30a and 30b.

The data line 20 may be disposed between the first and second pixel electrodes 30a and 30b, in each pixel 30. The data line 20 may be disposed in a direction intersecting the first and second gate lines 10a and 10b. The data line 20 may be connected to the first and second switching devices T1 and T2. The first and second switching devices T1 and T2, which are respectively connected to the first and second pixel electrodes 30a and 30b of each pixel 30, may be connected to a common data line 20. That is, one pixel 30 may be defined by one data line 20 and the two gate lines 10a and 10b. Accordingly, the display device according to some embodiments concept can reduce the number of data lines by half compared to a typical display device including one data line and gate line. For example, the typical display device may include 720 data lines and 320 gate lines in a Quarter Video Graphics Array (QVGA). On the other hand, the display device according to some embodiments may include 360 data lines and 640 gate lines in the Quarter Video Graphics Array (QVGA). A data driver (not shown) for applying a data signal to the data line 20 can be simplified in this structure because the number of data lines is reduced, thereby saving the cost of production. Accordingly, the display device according to some embodiments can increase productivity.

The dummy data line 22 and the data line 20 may be separated and disposed about one of the first and second pixel electrodes 30a and 30b. The dummy data line 22 and the data line 20 may be extended such that they are formed in parallel on each of two sides of one of the first and second pixel electrodes 30a and 30b. The dummy data line 22 may have the same line width as that of the data line 20. One end of a dummy data line 22 may be connected to the connection line 24, and the other end of the dummy data line 22 may be aligned with edges of the first and second pixel electrodes 30a and 30b in the opposite side of the connection line 24 or may protrude above the edges. Accordingly, the dummy data line 22 may be longer in the second direction than the first and second pixel electrodes 30a and 30b.

The connection line 24 may electrically connect the dummy data line 22 and the data line 20. The connection line 24 may be extended in the first direction, between the dummy data line 22 and the data line 20. The connection line 24 may overlap with at least one of the first and second gate lines 10a and 10b.

The data line 20 may be shifted in the first direction and patterned, in a process margin. For example, as illustrated in FIG. 3B, the data line 20 may be misaligned with respect to the first and second pixel electrodes 30a and 30b in patterning. The dummy data line 22 and the data line 20 may be shifted substantially to the same degree. The shift may be substantially the same because the data line 20 and the dummy data line 22 are designed at an equal distance in one mask. Accordingly, the dummy data line 22 and the data line 20 may be shifted by the same distance in the first direction.

As the data line 20 shifts the first pixel electrode 30a, the dummy data line 22 may shift the second pixel electrode 30b. Moreover, as the data line 20 overlaps with the first pixel electrode 30a, the dummy data line 22 may overlap with the second pixel electrode 30b. As the data line 20 overlaps with the second pixel electrode 30b, the dummy data line 22 may overlap with the first pixel electrode 30a. As the data line 20 shifts the second pixel electrode 30b, the dummy data line 22 may shift the first pixel electrode 30a. Therefore, the data line 20 and the dummy data line 22 may be symmetrically shifted with respect to the first and second pixel electrodes 30a and 30b.

With reference to FIG. 4A, when a data signal is applied to the data line 20, a first parasitic capacitance C1 may be induced between the data line 20 and the first pixel electrode 30a, and a second parasitic capacitance C2 may be induced between the data line 20 and the second pixel electrode 30b. When the data line 20 is not misaligned with respect to the first and second pixel electrodes 30a and 30b, the first and second parasitic capacitances C1 and C2 may have the same value. Furthermore, a third parasitic capacitance C3 may be induced between the dummy data line 22 and the first pixel electrode 30a, and a fourth parasitic capacitance C4 may be induced between the dummy data line 22 and the second pixel electrode 30b. When the dummy data line 22 is not misaligned, the third and fourth parasitic capacitances C3 and C4 may have the same value. When a distance between the first pixel electrode 30a and the data line 20 is the same as a distance between the second pixel electrode 30b and the dummy data line 22, the first and third parasitic capacitances C1 and C3 may have the same value. Therefore, each of the first to fourth parasitic capacitances C1 to C4 may have the same value.

With reference to FIG. 4B, when the data line 20 is misaligned, first and second parasitic capacitances C1 and C2 having different values may be generated from the first and second pixel electrodes 30a and 30b. Furthermore, dummy data line 22 may induce third and fourth parasitic capacitances C3 and C4 having different values than those of the first and second pixel electrodes 30a and 30b. When a distance between the first pixel electrode 30a and the data line 20 is the same as a distance between the second pixel electrode 30b and the dummy data line 22, the first and third parasitic capacitances C1 and C3 may have the same value. Moreover, when the overlapped area of the first pixel electrode 30a and data line 20 is the same as the overlapped area of the second pixel electrode 30b and dummy data line 22, the first and third parasitic capacitances C1 and C3 may have the same value. Accordingly, the first and third parasitic capacitances C1 and C3 may become a capacitance pair.

When a distance between the second pixel electrode 30b and the data line 20 is the same as a distance between the first pixel electrode 30a and the dummy data line 22, the second and fourth parasitic capacitances C2 and C4 may have the same value. Therefore, the second and fourth parasitic capacitances C2 and C4 may become a capacitance pair. Accordingly, as the first and third parasitic capacitances C1 and C3 increase, the second and fourth parasitic capacitances C2 and C4 may decrease.

With reference to FIG. 4B, although the data line 20 is misaligned, a sum of the first and fourth parasitic capacitances C1 and C4 that are induced from the data line 20 and the dummy data line 22 to the first pixel electrode 30a is constant. Also, sum of the second and third parasitic capacitances C2 and C3 that are induced from the data line 20 and the dummy data line 22 to the second pixel electrode 30b is constant. The sum of the first and fourth parasitic capacitances C1 and C4 is the same as the sum of the second and third parasitic capacitances C2 and C3. Parasitic capacitance asymmetry does not occur between the first and second pixel electrodes 30a and 30b. The dummy data line 22 can compensate a parasitic capacitance difference between the first and second pixel electrodes 30a and 30b due to misalignment of the data line 20. The dummy data line 22 may become a parasitic capacitance compensation data line.

Accordingly, although the data line 20 is misaligned, the display device according to some embodiments can prevent a vertically-striped blur from occurring by parasitic capacitance asymmetry between the first and second pixel electrodes 30a and 30b.

Figure 5:
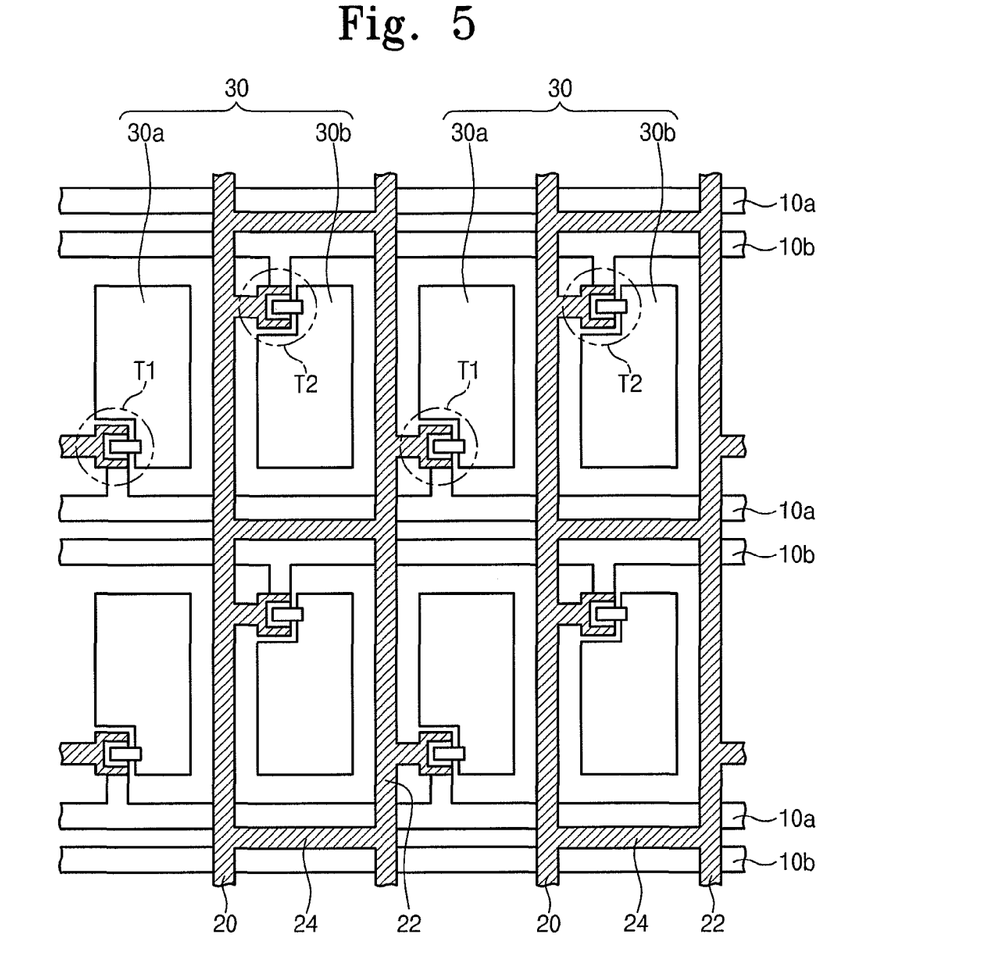
FIG. 5 is a plan view illustrating a display device according to some embodiments.

FIG. 5 is a plan view illustrating a display device according to another embodiment of the inventive concept.

Referring to FIG. 5, a display device according to some embodiments. The display device may include a data line 20 and a dummy data line 22 that are formed in parallel on each of two sides of one of first and second pixel electrodes 30a and 30b which are alternately disposed in a first direction. The dummy data line 22 and the data line 20 may have the same line width. The data line 20 and the dummy data line 22 may be extended in a second direction intersecting the first direction. The data line 20 and the dummy data line 22 may be connected by a connection line 24 that is disposed in the first direction. The adjacent first and second pixel electrodes 30a and 30b may be defined as one pixel 30. The first pixel electrode 30a may be connected to a first switching device T1, and the second pixel electrode 30b may be connected to a second switching device T2.

The data line 20 may be extended in the second direction, between the first and second pixel electrodes 30a and 30b of the each pixel 30. The dummy data line 22 may be extended in the second direction, in one side of one of the first and second pixel electrodes 30a and 30b of the each pixel 30. The data line 20 may be connected to one of the first and second switching devices T1 and T2, and the dummy data line 22 may be connected to the other one of the first and second switching devices T1 and T2. The dummy data line 22 may be longer in the second direction than the first and second pixel electrodes 30a and 30b. The connection line 24 may be extended in the first direction, between the dummy data line 22 and the data line 20. The connection line 24 may overlap with one of first and second gate lines 10a and 10b.

The data line 20, the dummy data line 22 and the connection line 24 may be disposed in a closed-loop shape that surrounds one of the first and second pixel electrodes 30a and 30b. Furthermore, the data line 20, the dummy data line 22 and the connection line 24 may be extended in a trapezoid shape that is configured to repeatedly surround one of the first and second pixel electrodes 30a and 30b in the second direction.

The data line 20 and the dummy data line 22 may be alternately disposed in the first direction, between the first and second pixel electrodes 30a and 30b. The data line 20 and the dummy data line 22 may be disposed in the first direction at an equal distance. The data line 20 may be misaligned with respect to the first and second pixel electrodes 30a and 30b in patterning. The dummy data line 22 and the data line 20 may be shifted identically. Accordingly, the dummy data line 22 and the data line 20 may be symmetrically shifted with respect to the first and second pixel electrodes 30a and 30b.

When the data line 20 is disposed at an equal distance from the first and second pixel electrodes 30a and 30b, parasitic capacitances having the same values may be induced from the first and second pixel electrodes 30a and 30b. When the data line 20 is closely concentrated in the first and second pixel electrodes 30a and 30b, parasitic capacitances having different values may be induced from the first and second pixel electrodes 30a and 30b.

The dummy data line 22 can compensate a parasitic capacitance difference between the first and second pixel electrodes 30a and 30b due to misalignment of the data line 20. The dummy data line 22 may become a parasitic capacitance compensation data line. The dummy data line 22 can be configured to remove parasitic capacitance asymmetry between the first and second pixel electrodes 30a and 30b.

Accordingly, although the data line 20 may be misaligned, the display device according to some embodiments can prevent a vertically-striped blur from occurring due to parasitic capacitance asymmetry between the first and second pixel electrodes 30a and 30b.

As described above, the display device according to some embodiments may include the data line and the dummy data line that are formed to be parallel and equally separated on each of two sides of one of the first and second pixel electrodes, and are electrically connected through the connection line. Although the data line may be misaligned with respect to one of the first and second pixel electrodes, the dummy data line can remove the difference between the parasitic capacitances that are induced by the data line. Accordingly, although the data line may be misaligned, the dummy data line can prevent a vertically-striped blur from occurring by the parasitic capacitance asymmetry between the first and second pixel electrodes.

According to some embodiments, a display device, which prevents a striped blur from being formed by the parasitic capacitance difference is disclosed.

According to some embodiments, a display device including: a plurality first gate lines and a plurality of second gate lines extended in a first direction; a plurality of data lines and a plurality dummy data lines extended in a second direction intersecting the first direction; and a plurality of pixels provided by intersection of the first gate line and data line. Each of the pixels includes: a first switching device connected to a first gate line of the first gate lines and one of a data line of the data lines and a dummy data line of the dummy data lines; a second switching device connected to a second data line of the second gate lines and another one of the data line and the dummy data line; a first pixel electrode connected to the first switching device, and provided between the data line and the dummy data line; and a second pixel electrode connected to the second switching device. The first pixel electrode is separated from the first pixel electrode while interposing one of the data line and the dummy data lines therebetween. The data line and the dummy data line are connected to one another.

According to some embodiments, the display device may further include a connection line connecting the data line and one end of the dummy data line.

According to some embodiments, the connection line may be extended in the second direction and overlap with the first gate line or the second gate line. The dummy data line may also be longer in the second direction than the first and second pixel electrodes.

According to some embodiments, another end of the dummy data line may be aligned with edges of the first and second pixel electrodes in the opposite side of the connection line, or protrude above the edges.

According to some embodiments, the first and second switching devices may be connected to the data line in common. The first switching device may also be connected to the dummy data line, and the second switching device may be connected to the data line.

According to some embodiments, the data line, the dummy data line and the connection line may be provided in a closed-loop shape which surrounds one of the first and second pixel electrodes.

According to some embodiments, the data line, the dummy data line and the connection line may be connected in a trapezoid shape. The data line and the dummy data line may also be configured to have the same line width.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and should not be restricted or limited by the foregoing detailed description.

What is claimed is:

1. A display device comprising:
 a plurality of first gate lines and a plurality of second gate lines configured to extend in a first direction;
 a plurality of data lines and a plurality dummy data lines configured to extend in a second direction, the first direction intersecting the second direction; and
 a plurality of pixels disposed at the intersections of the plurality of first gate lines and the plurality of data lines,
 wherein each of the pixels includes:
  a first switching device connected to a first gate line of the plurality of first gate lines, and one of a first data line of the plurality of data lines and a first dummy data line of the plurality of dummy data lines;
  a second switching device connected to a second gate line of the plurality of second gate lines, and the other one of first data line of the plurality of data lines and the first dummy data line of the plurality of dummy data lines;
  a connection line connecting the first data line and one end of the first dummy data line, wherein the connection line is extended in the first direction and is configured to overlap with one of the first gate line and the second gate line;
  a first pixel electrode connected to the first switching device, and provided between the first data line and the first dummy data line; and
  a second pixel electrode connected to the second switching device, and separated from the first pixel electrode while interposing one of the first data line and the first dummy data line therebetween, wherein the first data line is connected with the first dummy data line.

2. The display device of claim 1, wherein the first and second switching devices are commonly connected to the first data line.

3. The display device of claim 1, wherein the first data line and the first dummy data line are configured to have the same line width.

4. The display device of claim 1, wherein the first dummy data line is configured to have a length longer than a length of the first pixel electrode or the second pixel electrode in the second direction.

5. The display device of claim 4, wherein another end of the first dummy data line is aligned with edges of the first and second pixel electrodes on an opposite side of the connection line, or wherein the first dummy data line is configured to protrude above edges of the connection line.

6. The display device of claim 1, wherein the first switching device is connected to the first dummy data line and the second switching device is connected to the first data line.

7. The display device of claim 1, wherein the first data line, the first dummy data line and the connection line are provided in a closed-loop shape which surrounds one of the first and second pixel electrodes.

8. The display device of claim 7, wherein the first data line, the first dummy data line and the connection line are connected in a trapezoid shape.

9. A display device comprising:
- a plurality of first gate lines and a plurality of second gate lines configured to extend in a first direction;
- a plurality of dummy data lines and a plurality dummy data lines configured to extend in a second direction, the first direction intersecting the second direction;
- a plurality of pixels disposed at the intersections of the plurality of first gate lines and the plurality of data lines;
- wherein each of the pixels includes:
  - a first switching device connected to a first gate line of the plurality of first gate lines, and one of a first data line of the plurality of data lines and a first dummy data line of the plurality of dummy data lines;
  - a second switching device connected to a second gate line of the plurality of second gate lines, and the other one of first data line of the plurality of data lines and the first dummy data line of the plurality of dummy data lines; a connection line connecting the first data line and one end of the first dummy data line, wherein the connection line configured to overlap with one of the first gate line and the second gate line; and
  - a first pixel electrode connected to the first switching device, and provided between the first data line and the first dummy data line; and
  - a second pixel electrode connected to the second switching device, and separated from the first pixel electrode while interposing one of the first data line and the first dummy data line therebetween,
- wherein the first dummy line is configured to have a length longer than a length of the first pixel electrode or the second pixel electrode in the second direction and another end of the first dummy data line is aligned with edges of the first and second pixel electrodes on an opposite side of the connection line, or wherein the first dummy data line is configured to protrude above edges of the connection line.

* * * * *

UNITED STATES PATENT AND TRADEMARK OFFICE
CERTIFICATE OF CORRECTION

PATENT NO. : 8,513,665 B2  
APPLICATION NO. : 13/160421  
DATED : August 20, 2013  
INVENTOR(S) : Park Page 1 of 1

It is certified that error appears in the above-identified patent and that said Letters Patent is hereby corrected as shown below:

In the Specifications:

In column 3 at line 10, Change "substrate40" to --substrate 40--.

In column 3 at line 15, Change "substrate40" to --substrate 40--.

In column 3 at lines 17-18, Change "substrate40" to --substrate 40--.

In column 3 at line 63, Change "substrate40" to --substrate 40--.

In column 4 at line 1, Change "substrate40." to --substrate 40.--.

In column 4 at lines 1-2, Change "substrate40" to --substrate 40--.

In the Claims:

In column 9 at line 11, In Claim 9, Change "dummy data" to --data--.

In column 9 at lines 11-12, In Claim 9, Change "a plurality dummy data lines" to --a plurality of dummy data lines--.

Signed and Sealed this  
Sixth Day of May, 2014

Michelle K. Lee  
*Deputy Director of the United States Patent and Trademark Office*